United States Patent
Koo et al.

(10) Patent No.: US 10,004,153 B2
(45) Date of Patent: Jun. 19, 2018

(54) CASSETTE FOR CURVED SUBSTRATES

(71) Applicant: Samsung Display Co. Ltd., Yongin-si (KR)

(72) Inventors: Ja Huem Koo, Seoul (KR); Min Yeob Kang, Changwon-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 148 days.

(21) Appl. No.: 15/222,112

(22) Filed: Jul. 28, 2016

(65) Prior Publication Data
US 2017/0172000 A1   Jun. 15, 2017

(30) Foreign Application Priority Data
Dec. 11, 2015  (KR) .................. 10-2015-0176707

(51) Int. Cl.
| | |
|---|---|
| *B65D 85/48* | (2006.01) |
| *H05K 5/02* | (2006.01) |
| *B65D 85/30* | (2006.01) |
| *B65D 25/10* | (2006.01) |

(52) U.S. Cl.
CPC ......... *H05K 5/0217* (2013.01); *B65D 25/107* (2013.01); *B65D 85/30* (2013.01)

(58) Field of Classification Search
USPC .................. 206/591, 593, 594, 587, 722
See application file for complete search history.

(56) References Cited

U.S. PATENT DOCUMENTS

| | | | | |
|---|---|---|---|---|
| 3,381,782 A | * | 5/1968 | Ikelheimer ............ | A45C 13/02 190/110 |
| 6,145,663 A | * | 11/2000 | Kim .................... | B65D 81/113 206/454 |
| 7,374,044 B2 | * | 5/2008 | Ting .................... | B65D 5/5085 206/454 |
| 7,604,121 B1 | * | 10/2009 | Tang .................... | B65D 25/06 206/454 |
| 8,777,008 B2 | * | 7/2014 | Hu ....................... | B65D 25/103 206/454 |
| 8,807,341 B2 | * | 8/2014 | Chan ................... | B65D 85/30 206/523 |
| 2005/0173294 A1 | * | 8/2005 | Chen .................. | B65D 5/48046 206/593 |

FOREIGN PATENT DOCUMENTS

JP          2539717       4/1997

* cited by examiner

*Primary Examiner* — Jacob K Ackun
(74) *Attorney, Agent, or Firm* — Cantor Colburn LLP

(57) ABSTRACT

A cassette includes a base plate in which first and second holes are defined at both opposite edges thereof, a protector which is coupled to the first hole disposed at the both opposite edges of the base plate, is placed in a direction perpendicular to a plane of the base plate, and third holes, and a rib member which includes a rib protruding from the protector, a second protrusion protruding in a direction from the rib to be coupled to the second hole, and third protrusions protruding in another direction from the rib to be coupled to the third holes, where the third holes of the rib member are defined to slope at a predetermined angle to a thickness surface of the protector such that the rib is at a predetermined angle to a plane of the protector, and the third protrusions are coupled to the third holes.

20 Claims, 13 Drawing Sheets

CASSETTE FOR CURVED SUBSTRATES

This application claims priority to Korean Patent Application No. 10-2015-0176707 filed on Dec. 11, 2015, and all the benefits accruing therefrom under 35 U.S.C. §119, the content of which in its entirety is herein incorporated by reference.

BACKGROUND

1. Field

Exemplary embodiments of the invention relate to a cassette for curved substrates.

2. Description of the Related Art

To transport a plurality of substrates used in display panels, a carrying device is generally utilized. Ribs may be installed on a cassette for accommodating substrates, for example, and one substrate may be inserted into a gap between adjacent ribs. Thus, a plurality of substrates can be loaded into the cassette and transported simultaneously.

SUMMARY

While ends of each substrate inserted into a gap between adjacent ribs of the cassette are supported by the ribs, a middle portion thereof is not supported by any supporting members. As a result, in a case of substrates for large-area display panels, the substrates may be bent. Accordingly, the middle portion of each of the substrates may contact that of another substrate and thus be damaged.

In particular, when curved substrates having certain curvature are loaded into the cassette, an upper substrate and a lower substrate may get caught on or contact each other.

Further, to manufacture a cassette for loading a plurality of curved substrates, a mold is required. However, manufacturing a cassette of each size using a mold may significantly increase manufacturing costs. In addition, a cassette manufactured using a mold has a limited loading capacity due to many shaping limitations.

Exemplary embodiments of the invention provide a cassette for curved substrates, in which sloping ribs prevent the contact between curved substrates and into or from which the curved substrates may be easily inserted or removed.

Exemplary embodiments of the invention also provide a cassette for curved substrates, the cassette being including paper to reduce manufacturing costs and improve loading capacity.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided a cassette for curved substrates, the cassette including a base plate which includes first and second holes disposed at both edges thereof, a protector which is coupled to the first hole disposed at both edges of the base plate, is placed in a direction perpendicular to a plane of the base plate, and has a plurality of third holes, and a rib member which includes a rib protruding from the protector to support a curved substrate, a second protrusion protruding in a direction from the rib to be coupled to the second hole, and a plurality of third protrusions protruding in another direction from the rib to be coupled to the third holes, where the third holes of the rib member are defined to slope at a predetermined angle to a thickness surface of a protector such that the rib is at a predetermined angle to a plane of the protector, and the third protrusions are coupled to the third holes.

In an exemplary embodiment, the base plate, the protector, and the rib member may include a paper material.

In an exemplary embodiment, the protector may include a plurality of laminate layers.

In an exemplary embodiment, the protector may include a first protrusion protruding from a body thereof, where the first protrusion is coupled to the first hole.

In an exemplary embodiment, the second and third protrusions may be perpendicular to each other with respect to the rib.

In an exemplary embodiment, the second protrusion, the third protrusions, and the rib are unitary with each other, and the rib may be placed to slope at a predetermined angle to any direction by coupling directions of the second and third protrusions.

In an exemplary embodiment, the rib member may be disposed at both edges of the base plate and protrudes from the body of the protector to be separated from each adjacent rib member by an equal distance, where the rib member disposed at an edge of the base plate corresponds to the rib member disposed at the other edge of the base plate.

In an exemplary embodiment, the second protrusion may be coupled to the second hole defined in the same direction as a direction in which the rib slopes.

In an exemplary embodiment, a (3-a)-th hole defined in a first laminate layer, a (3-b)-th hole defined in a second laminate layer, and a (3-c)-th hole defined in a third laminate layer may be defined in the protector.

In an exemplary embodiment, the (3-a)-th hole, the (3-b)-th hole, and the (3-c)-th hole may be defined parallel to the base plate or parallel to a direction normal to a lengthwise direction of the protector and are partially misaligned with each other to define each of the third holes in a staircase shape.

In an exemplary embodiment, each of the third holes 230 defined in a staircase shape by the partial misalignment of the (3-a)-th hole, the (3-b)-th hole and the (3-c)-th hole may have a predetermined angle of inclination to the plane of the protector.

In an exemplary embodiment, the rib member may include a first rib and a second rib having different shapes, where the second rib further includes an extension portion which extends relatively further toward the third protrusions than the first rib.

In an exemplary embodiment, the extension portion and the first rib may contact the plane of the protector.

In an exemplary embodiment, the third protrusions of the first rib may be different in size from those of the second rib.

In an exemplary embodiment, the third protrusions of the first rib may be asymmetrical to those of the second rib.

In an exemplary embodiment, the second protrusion of the first rib may be different in size from that of the second rib.

In an exemplary embodiment, a folding region may be disposed between the first rib and the second rib.

In an exemplary embodiment, the rib member may include the third protrusions on the first rib and may further include fourth protrusions on the second rib, and the protector further includes fourth holes coupled to the fourth protrusions.

In an exemplary embodiment, a third rib may be further disposed between the first rib and the second rib.

In an exemplary embodiment, the third rib may be filled with air.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

Figure 1:
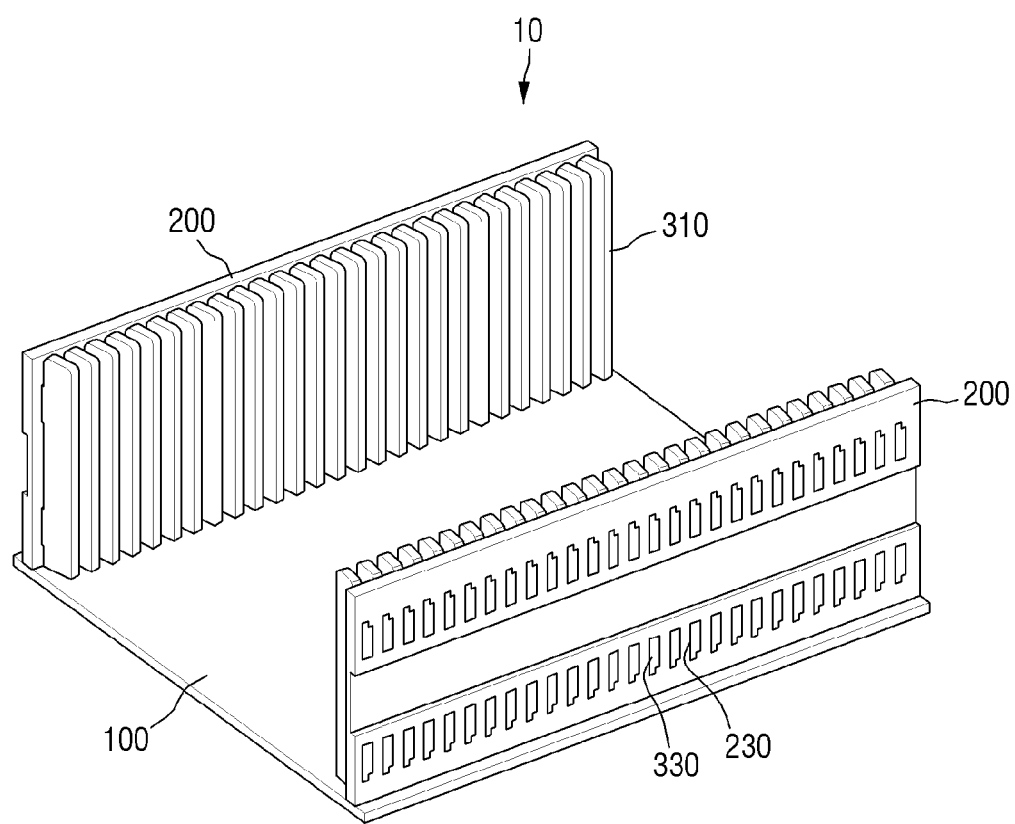
FIG. 1 is a perspective view of an exemplary embodiment of a cassette for curved substrates according to the invention.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this invention will be thorough and complete and will fully convey the concept of the invention to those skilled in the art, and the invention will only be defined by the appended claims. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The invention will now be described more fully with reference to the accompanying drawings, in which exemplary embodiments of the invention are shown.

Figure 2:
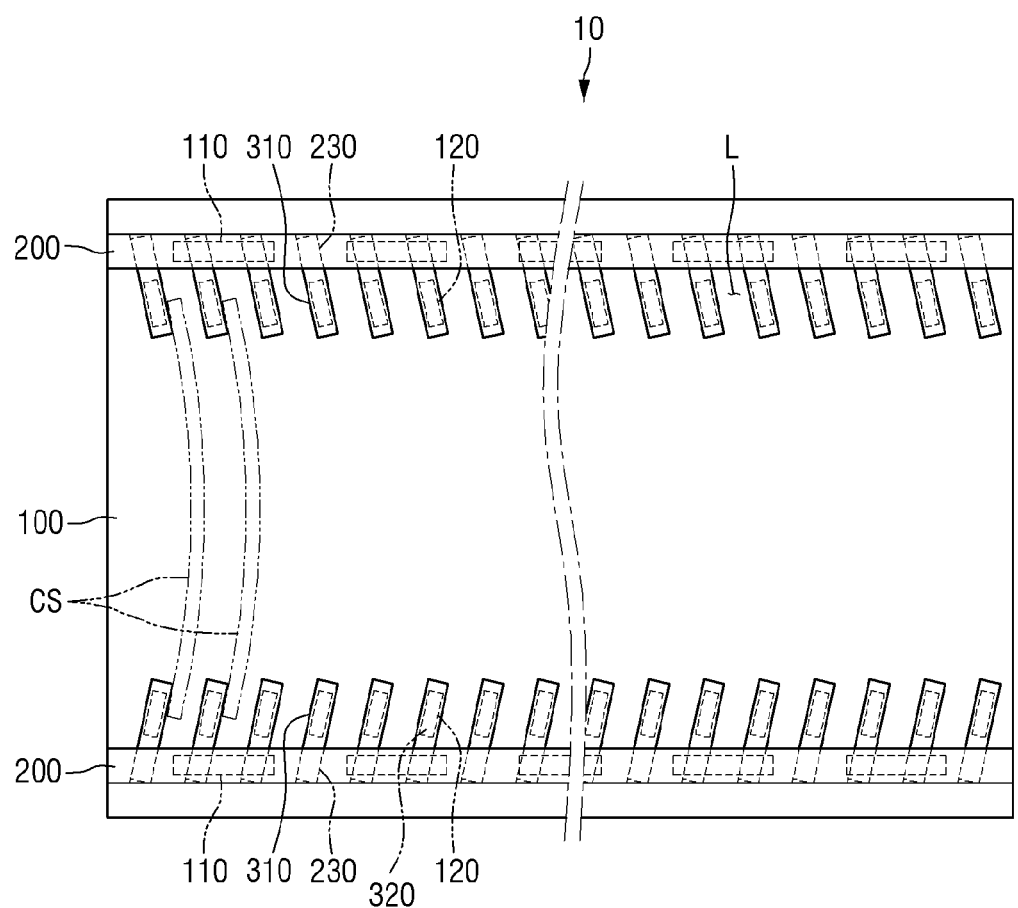
FIG. 2 is a plan view of the cassette illustrated in FIG. 1.
Figure 3:
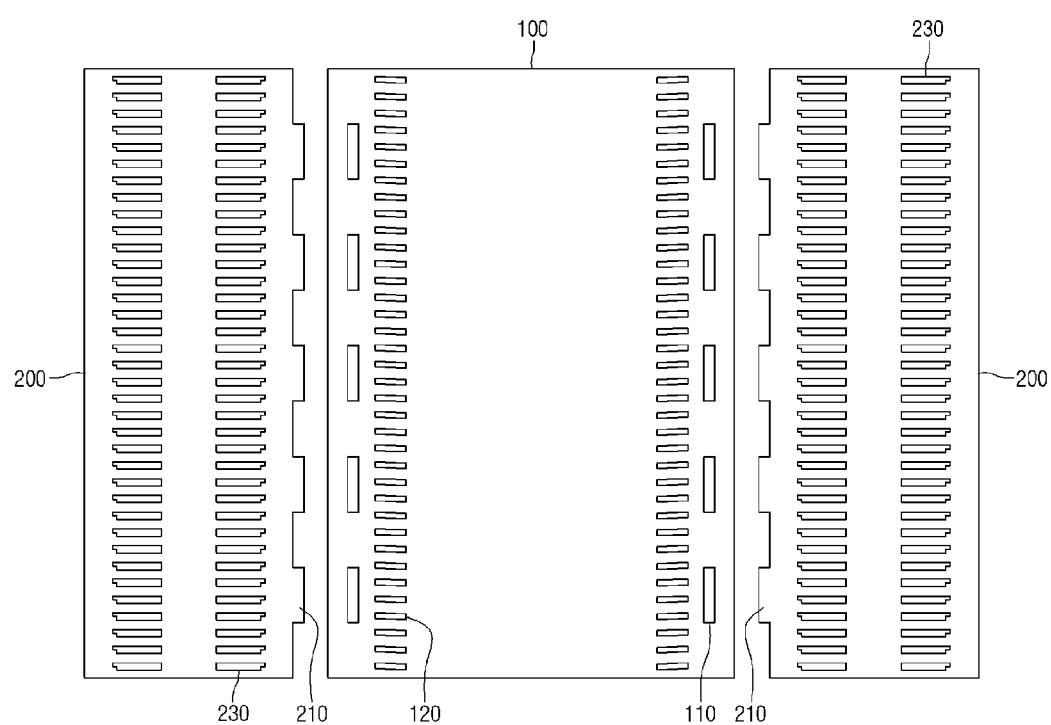
FIG. 3 is an exploded plan view of the cassette illustrated in FIG. 1.
Figure 4:
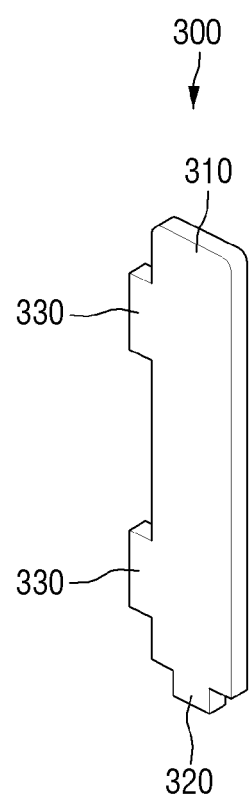
FIG. 4 is a perspective view of a rib member of the cassette illustrated in FIG. 1.

FIG. 1 is a perspective view of a cassette 10 for curved substrates according to an exemplary embodiment of the invention. FIG. 2 is a plan view of the cassette 10 illustrated in FIG. 1. FIG. 3 is an exploded plan view of the cassette 10 illustrated in FIG. 1. FIG. 4 is a perspective view of a rib member 300 of the cassette 10 illustrated in FIG. 1.

Referring to FIGS. 1 through 4, the cassette 10 includes a base plate 100 in which a plurality of first holes 110 and a plurality of second holes 120 are defined at both edges thereof, a protector 200 which is coupled to the first holes 110 disposed at both edges of the base plate 100, extends in a direction perpendicular to a plane of the base plate 100, and in which a plurality of third holes 230 is defined, and a plurality of rib members 300 which include a plurality of ribs 310 protruding from the protector 200 to support curved substrates CS, a plurality of second protrusions 320 protruding in a direction from the ribs 310 to be coupled to the second holes 120, and a plurality of third protrusions 330 protruding in another direction from the ribs 310 to be coupled to the third holes 230.

In an exemplary embodiment, the curved substrates CS may be mobile phones, monitors, or televisions, for example. In an exemplary embodiment, the curved substrates CS may be finished products or half-finished products. Curved displays based on the curved substrates CS may, when large-sized, increase the degree of immersion in images through color reproducibility and may, when small-sized, improve grip feeling.

The cassette 10 for loading or carrying the curved substrates CS may include the base plate 100.

The base plate 100 may include a paper material. To withstand the weight of the curved substrates CS, the base plate 100 may be provided by stacking multiple layers of paper having certain strength to a predetermined thickness. Here, the base plate 100 may have various thicknesses and strength levels by stacking multiple layers of paper according to the type of the curved substrates CS to be loaded or carried.

A plurality of holes may be defined in the plane of the base plate 100. The first holes 110 may be defined adjacent to at least one side region of the base plate 100. The first holes 110 may be defined in both side regions of the base plate 100 to correspond to each other.

The protector 200 may extend along both edges of the base plate 100, and the first holes 110 may support and fix the protector 200. the second holes 120 adjacent to the first holes 110 may be defined in the base plate 100. The rib members 300 may be coupled to the second holes 120.

The cassette 10 may include the protector 200. The protector 200 includes a body and a plurality of first protrusions 210 protruding from the body. The first protrusions 210 may protrude from any one thickness surface of the body such that a plane of the body is perpendicular to the plane of the base plate 100.

The first protrusions 210 may be coupled to the first holes 110. The protector 200 may extend from both edges of the base plate 100 in a direction perpendicular to the plane of the base plate 100, thereby defining a housing space with the base plate 100.

The curved substrates CS may be loaded or carried in the housing space. The protector 200 may make it easy to transport the curved substrates CS loaded into the housing space and protect the curved substrates CS from external impact.

The first protrusions 210 of the protector 200 may be coupled to the first holes 110. The first protrusions 210 may protrude from the body of the protector 200 and may be coupled to the first holes 110 defined in the direction normal to the plane of the base plate 100. Accordingly, the first protrusions 210 may support and fix the protector 200 in a direction perpendicular to the plane of the base plate 100.

The protector 200 may include a paper material having a predetermined thickness. In addition, a plurality of layers of paper, each layer having a predetermined thickness, may be stacked to provide certain strength. Here, the layers of paper stacked are defined as laminate layers 200a, 200b and 200c.

The third holes 230, each defined by connecting a plurality of holes that partially overlap the laminate layers, may be defined in the protector 200. Accordingly, the third holes 230 may slope at a predetermined angle to a cross-sectional direction of the protector 200. The third holes 230 sloping at the predetermined angle to the cross-sectional direction of the protector 200 will be described in detail later with reference to FIGS. 5 and 6.

The cassette 10 may include the rib members 300. The rib members 300 include the ribs 310 which support the curved substrates CS, the second protrusions 320 (refer to FIG. 4) which protrude in a direction from the ribs 310, and the third protrusions 330 which protrude in another direction from the ribs 310.

Each of the rib members 300 may be a stack of multiple layers of paper. Each of the rib members 300 may be provided by stacking multiple layers of paper such that the ribs 310 may have enough strength to support the curved substrates CS. However, the invention is not limited thereto, and each of the rib members 300 may also be provided by folding paper in half or connecting pieces of paper of various shapes.

A part of each of the rib members 300 may be coupled to the protector 200, and another part of each of the rib members 300 may be coupled to the base plate 100.

The second protrusions 320 of the rib members 300 may be coupled to the base plate 100 and protrude from the ribs 310 toward the base plate 100. In addition, the third protrusions 330 of the rib members 300 may be coupled to the protector 200 and protrude from the ribs 310 toward the protector 200. Therefore, since the plane of the base plate 100 and the body of the protector 200 are placed perpendicular to each other, the second protrusions 320 and the third protrusions 330 may be perpendicular to each other with respect to the ribs 310.

The third protrusions 330 of the rib members 300 may be coupled to the third holes 230 of the protector 200. In addition, the second protrusions 320 of the rib members 300 may be coupled to the second holes 120 of the base plate 100.

The rib members 300 may be disposed at both edges of the base plate 100 and protrude from the body of the protector 200 at equal intervals. The rib members 300 disposed at an edge of the base plate 100 may correspond to those disposed at the other edge of the base plate 100.

The rib members 300 may be coupled to the second holes 120, respectively. Here, the second holes 120 may be separated from each other by a predetermined gap. Accordingly, the ribs 310 may be separated from each other by the predetermined gap, and each of the curved substrates CS may be loaded and carried on the predetermined gap. That is, the gap which is a space for loading and carrying a curved substrate CS is defined as a loading region L.

A length to which the ribs 310 protrude from the protector 200 may vary according to a shape or a size of the curved substrates CS. In other words, when the curved substrates CS are large-sized televisions, for example, the ribs 310 may protrude from the protector 200 with a length that may support the weight of the large-sized televisions. When the curved substrates CS are small-sized smartphones, for example, the ribs 310 may protrude from the protector 200 with a length that may support the weight of the smartphones.

Therefore, since the ribs 310 support the curved substrates CS by substantially contacting the curved substrates CS, the loading region L between adjacent ribs 310 and the protruding length of the ribs 310 may vary according to the type of the curved substrates CS. Here, the ribs 310 may support the curved substrates CS by contacting edges of concave surfaces of the curved substrates CS. In addition, the gap between the second holes 120 coupled to the rib members 300 may vary according to the loading region L.

Loading defects may occur when the curved substrates CS are loaded on the loading regions L. To prevent the loading defects, the curved substrates CS may be placed at predetermined intervals, and the ribs 310 may be placed to slope to correspond to the shape of the curved substrates CS having concave and convex surfaces. In other words, the ribs 310 may be placed at an angle to the plane of the protector 200 by the third protrusions 330 and the third holes 230.

Specifically, the third holes 230 may be defined in the body of the protector 200 to slope at a predetermined angle to a cross-section of the protector 200, and the third protrusions 330 may be coupled to the sloping third holes 230. Therefore, the ribs 310 unitary with the third protrusions 330 may be placed to slope at the predetermined angle to the plane of the protector 200 by the third protrusions 330 and the third holes 230.

In addition, to maintain the slope of the ribs 310 of the rib members 300, the second holes 120 coupled to the second protrusions 320 may extend in the same direction as a direction in which the ribs 310 slope. However, the invention is not limited thereto, and the second holes 120 may also extend in a direction opposite to the direction in which the ribs 310 slope in order to increase a force that supports and fixes the curved substrates CS.

As described above, the second protrusions 320, the third protrusions 330 and the ribs 310 may be unitary with each other, and the ribs 310 may be placed to slope at a predetermined angle to the plane of the protector 200 by coupling directions of the second and third protrusions 320 and 330.

Therefore, the ribs 310 corresponding to the shape of the curved substrates CS with the concave and convex surfaces, that is, the ribs 310 sloping at a predetermined angle to the plane of the protector 200 may prevent the contact between the curved substrates CS and make it easy to insert or remove the curved substrates CS. In addition, the cassette 10 including paper may reduce manufacturing costs and improve loading capacity.

Figure 5:
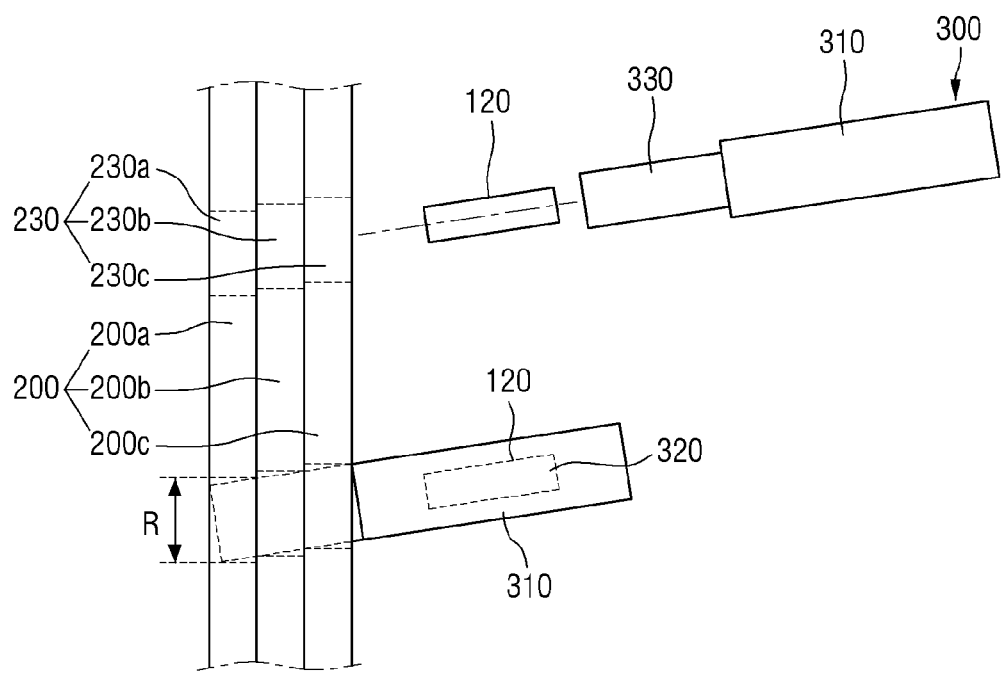
FIG. 5 is a cross-sectional view illustrating the coupling of a protector to rib members in the cassette of FIG. 1.
Figure 6:
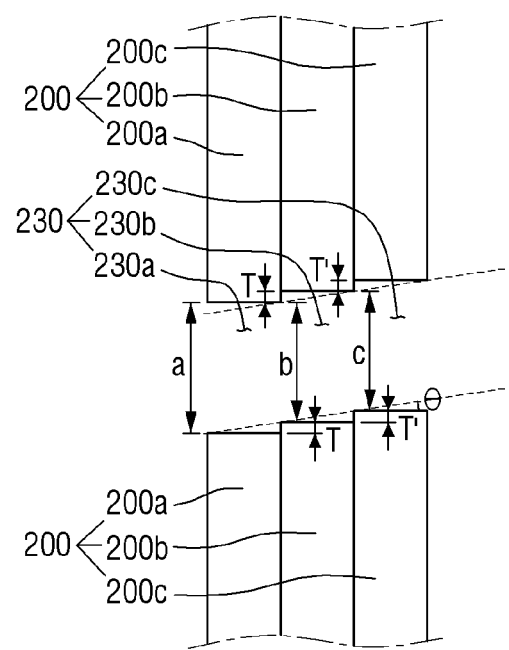
FIG. 6 is an enlarged cross-sectional view of the protector of the cassette of FIG. 1.

FIG. 5 is a cross-sectional view illustrating the coupling of the protector 200 to the rib members 300 in the cassette 10 of FIG. 1. FIG. 6 is an enlarged cross-sectional view of the protector 200 of the cassette 10 of FIG. 1.

Here, FIGS. 1 through 4 will be cited for ease of description and to avoid a redundant description.

Referring to FIGS. 5 and 6, the protector 200 may include a plurality of laminated layers of paper. The protector 200 may include the third holes 230, and each of the third holes 230 may include holes respectively defined in the laminated layers of paper. The protector 200 may include a stack of a first laminate layer 200a, a second laminate layer 200b, and a third laminate layer 200c.

In a specific example, $(3\text{-a})^{th}$ holes 230a may be defined in the first laminate layer 200a, the second laminate layer 200b may include $(3\text{-b})^{th}$ holes 230b may be defined in the second laminate layer 200b, and $(3\text{-c})^{th}$ holes 230c may be defined in the third laminate layer 200c. Here, a case where the protector 200 includes three laminate layers is described as an example. However, the invention is not limited to this case, and the protector 200 may also include four or five laminate layers, for example.

The $(3\text{-a})^{th}$ holes 230a, the $(3\text{-b})^{th}$ holes 230b, and the $(3\text{-c})^{th}$ holes 230c may be defined parallel to the base plate 100 or parallel to the direction normal to a lengthwise direction of the protector 200 and may be partially misaligned with each other. Due to such disposition of the $(3\text{-a})^{th}$ holes 230a, the $(3\text{-b})^{th}$ holes 230b and the $(3\text{-c})^{th}$ holes 230c, each of the third holes 230 may be defined in a staircase shape, for example.

The third protrusions 330 may be coupled to the third holes 230 defined in a staircase shape by the disposition of the $(3\text{-a})^{th}$ holes 230a, the $(3\text{-b})^{th}$ holes 230b and the $(3\text{-c})^{th}$ holes 230c. Accordingly, the third protrusions 330 may be forcibly fitted into the third holes 230. The third holes 230 having the staircase shape may improve the capability of the third protrusions 330 to maintain a slope. Thus, the ribs 310 may maintain a predetermined angle to the plane of the protector 200. Further, since the second protrusions 320 of the rib members 300 are coupled to the sloping second holes 120, the slope-maintaining capability may be further improved.

In an exemplary embodiment, the $(3\text{-a})^{th}$ through $(3\text{-c})^{th}$ holes 230a through 230c may have the same radius R, for example. However, the invention is not limited thereto. That is, the $(3\text{-a})^{th}$ hole 230a, the $(3\text{-b})^{th}$ hole 230b, and the $(3\text{-c})^{th}$ hole 230c may be different from one another.

When the $(3\text{-a})^{th}$ holes 230a, the $(3\text{-b})^{th}$ holes 230b, and the $(3\text{-c})^{th}$ holes 230c have the same radius, the $(3\text{-b})^{th}$ holes 230b may partially overlap the $(3\text{-a})^{th}$ holes 230a and may be partially misaligned with the $(3\text{-a})^{th}$ holes 230a. Here, a region in which each of the $(3\text{-b})^{th}$ holes 230b partially overlaps a corresponding one of the $(3\text{-a})^{th}$ holes 230a is defined as a 'b' region. The $(3\text{-c})^{th}$ holes 230c may partially overlap the $(3\text{-b})^{th}$ holes 230b. A region in which each of the $(3\text{-c})^{th}$ holes 230c partially overlaps a corresponding one of the $(3\text{-b})^{th}$ holes 230b is defined as a 'c' region.

In addition to the 'b' region in which each of the $(3\text{-b})^{th}$ holes 230b partially overlaps the corresponding one of the $(3\text{-a})^{th}$ holes 230a, a region in which each of the $(3\text{-b})^{th}$ holes 230b is misaligned with the corresponding one of the $(3\text{-a})^{th}$ holes 230a is defined as a T region. In addition to the 'c' region in which each of the $(3\text{-c})^{th}$ holes 230c partially overlaps the corresponding one of the $(3\text{-b})^{th}$ holes 230b, a region in which each of the $(3\text{-c})^{th}$ holes 230c is misaligned with the corresponding one of the $(3\text{-b})^{th}$ holes 230b is defined as a T' region. The T region and the T' region may include a lower region which is inside an 'a' region and an upper region which is outside the 'a' region.

Therefore, a virtual line extending from the 'a' region to the 'b' region and the cross-sectional direction of the protector 200 may define an angle of inclination θ. The angle of inclination θ may also be defined in the 'b' region and the 'c' region. The angle of inclination θ may be an angle at which the ribs 310 are placed with respect to the plane of the protector 200.

The curved substrates CS may be placed on the ribs 310 sloping at the angle of inclination θ. Since the curved substrates CS having various radii of curvature are placed on the ribs 310 sloping at the angle of inclination θ, the interference with adjacent curved substrates CS may be reduced.

Referring again to FIG. 6, the angle of inclination θ may also be determined by thicknesses of the first laminate layer 200a, the second laminate layer 200b, and the third laminate layer 200c and by the positional relationship among the 'a' region, the 'b' region and the 'c' region. The positional relationship among the 'a' region, the 'b' region and the 'c' region will be described in detail with reference to FIG. 7 and Table 1.

As described above, the formation of a plurality of holes 230a, 230b and 230c misaligned with each other in a plurality of laminate layers 200a, 200b and 200c of the protector 200 may define the angle of inclination θ of the ribs 310 with respect to the plane of the protector 200.

Therefore, the angle of inclination θ of the ribs 310 may prevent the collision between the ribs 310 and convex regions of the curved substrates CS due to the curvature of the curved substrates CS.

Figure 7:
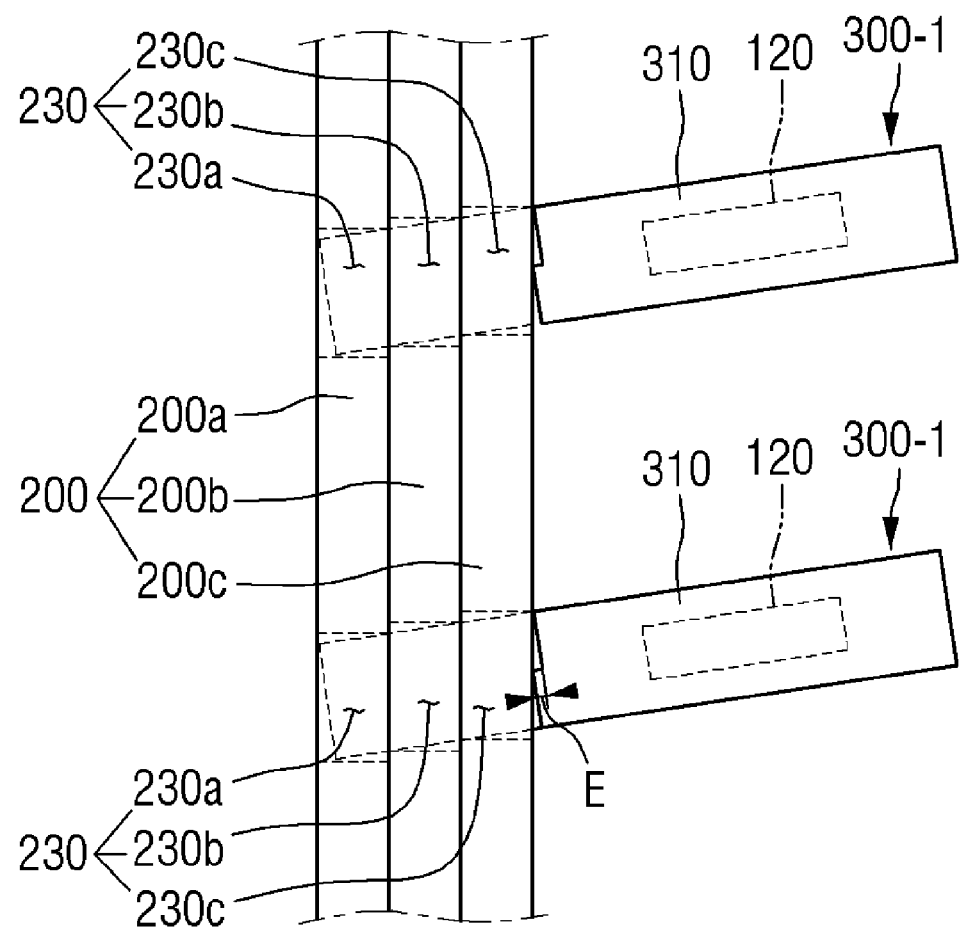
FIG. 7 is a cross-sectional view illustrating another exemplary embodiment of the coupling of a protector to rib members in a cassette for curved substrates according to the invention.
Figure 8:
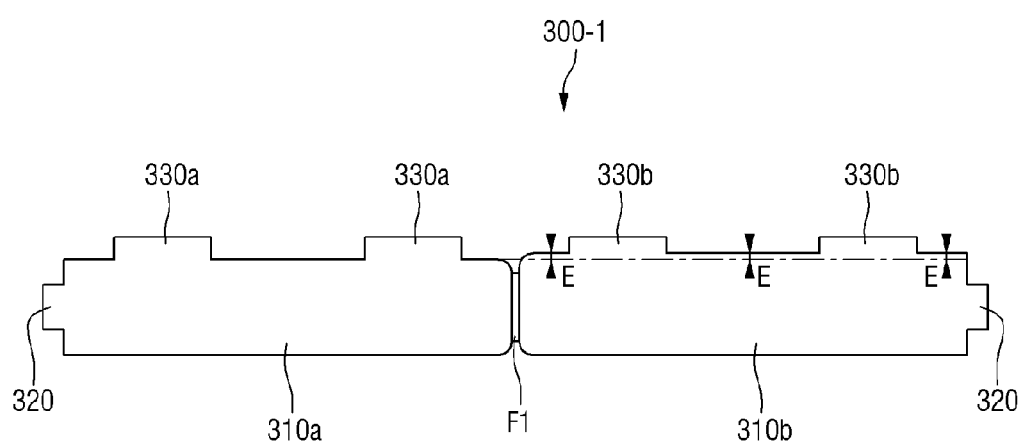
FIG. 8 is a plan view of a rib member in the cassette of FIG. 7.
Figure 9:
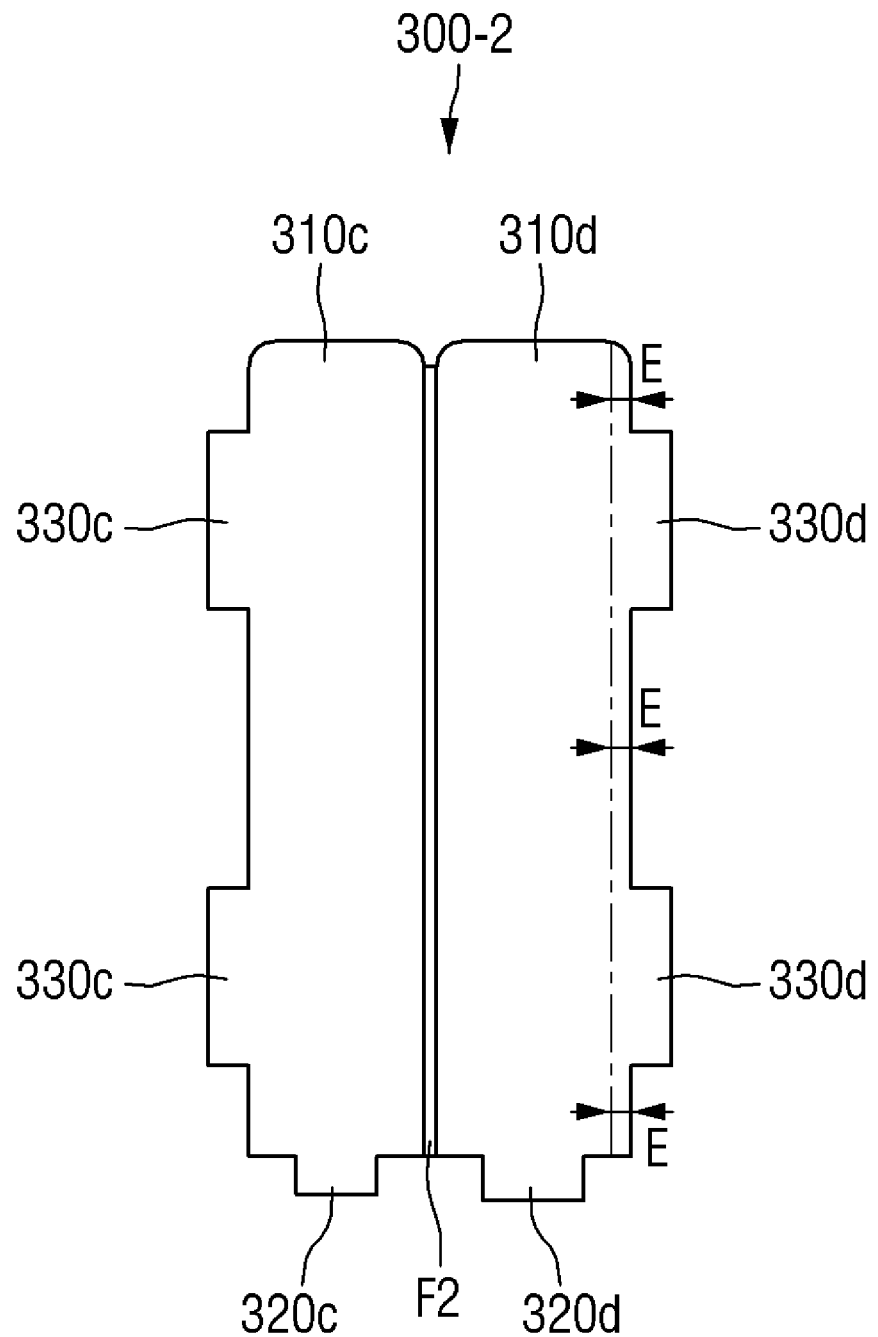
FIGS. 9 and 10 are plan views of other exemplary embodiments of rib members in cassettes for curved substrates according to the invention.
Figure 10:
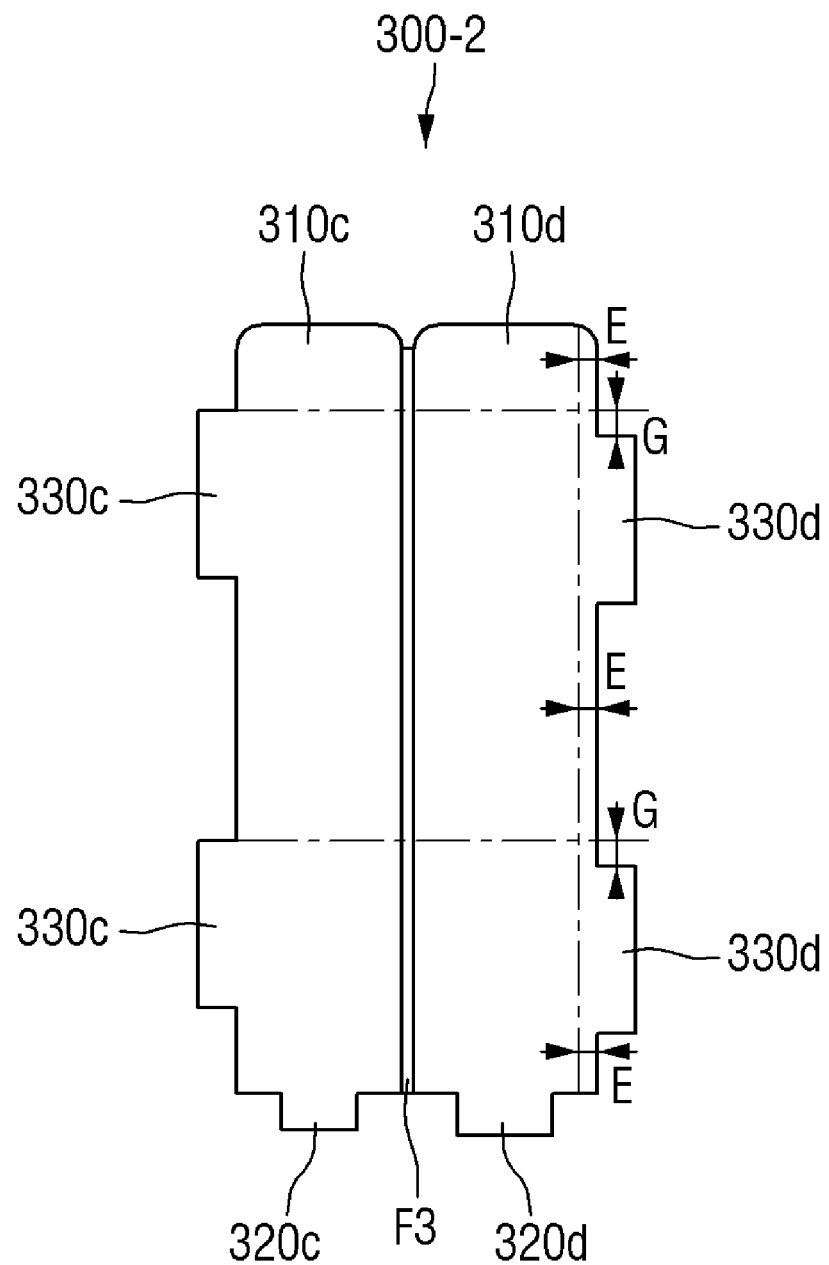

FIG. 7 is a cross-sectional view illustrating the coupling of a protector 200 to rib members 300-1 in a cassette for curved substrates according to another exemplary embodiment of the invention. FIG. 8 is a plan view of a rib member 300-1 in the cassette of FIG. 7. FIGS. 9 and 10 are plan views of rib members 300-2 in cassettes for curved substrates according to other exemplary embodiments of the invention.

Here, FIGS. 1 through 6 will be cited for ease of description and to avoid a redundant description.

Referring to FIGS. 7 and 8, the protector 200 may include a plurality of laminated layers of paper. The protector 200 may include third holes 230, and each of the third holes 230 may include holes respectively defined in the laminated layers of paper. The protector 200 may include a stack of a first laminate layer 200a, a second laminate layer 200b, and a third laminate layer 200c.

In a specific example, (3-a)$^{th}$ holes 230a may be defined in the first laminate layer 200a, (3-b)$^{th}$ holes 230b may be defined in the second laminate layer 200b, and (3-c)$^{th}$ holes 230c may be defined in the third laminate layer 200c. Here, a case where the protector 200 includes three laminate layers is described as an example. However, the invention is not limited to this case, and the protector 200 may also include four or five laminate layers, for example.

The (3-a)$^{th}$ holes 230a, (3-b)$^{th}$ holes 230b, and the (3-c)$^{th}$ holes 230c may be defined parallel to a base plate 100 or parallel to the direction normal to a lengthwise direction of the protector 200. Due to such disposition of the (3-a)$^{th}$ holes 230a, the (3-b)$^{th}$ holes 230b and the (3-c)$^{th}$ holes 230c, each of the third holes 230 may be defined in a staircase shape, for example.

Third protrusions 330 may be coupled to the third holes 230 defined in a staircase shape by the disposition of the (3-a)$^{th}$ holes 230a, the (3-b)$^{th}$ holes 230b and the (3-c)$^{th}$ holes 230c. Accordingly, the third protrusions 330 may be forcibly fitted into the third holes 230. The third holes 230 having the staircase shape may improve the capability of the third protrusions 330 to maintain a slope. Thus, ribs 310 may maintain a predetermined angle to a plane of the protector 200. Further, since second protrusions 320 of the rib members 300-1 are coupled to sloping second holes 120, the slope-maintaining capability may be further improved.

Referring to FIG. 6, when the (3-a)$^{th}$ holes 230a, the (3-b)$^{th}$ holes 230b, and the (3-c)$^{th}$ holes 230c have the same radius, the (3-b)$^{th}$ holes 230b may partially overlap the (3-a)$^{th}$ holes 230a and may be partially misaligned with the (3-a)$^{th}$ holes 230a. Here, a region in which each of the (3-b)$^{th}$ holes 230b partially overlaps a corresponding one of the (3-a)$^{th}$ holes 230a is defined as a 'b' region. The (3-c)$^{th}$ holes 230c may partially overlap the (3-b)$^{th}$ holes 230b. A region in which each of the (3-c)$^{th}$ holes 230c partially overlaps a corresponding one of the (3-b)$^{th}$ holes 230b is defined as a 'c' region.

In addition to the 'b' region in which each of the (3-b)$^{th}$ holes 230b partially overlaps the corresponding one of the (3-a)$^{th}$ holes 230a, a region in which each of the (3-b)$^{th}$ holes 230b is misaligned with the corresponding one of the (3-a)$^{th}$ holes 230a is defined as a T region. In addition to the 'c' region in which each of the (3-c)$^{th}$ holes 230c partially overlaps the corresponding one of the (3-b)$^{th}$ holes 230b, a region in which each of the (3-c)$^{th}$ holes 230c is misaligned with the corresponding one of the (3-b)$^{th}$ holes 230b is defined as a T' region. The T region and the T' region may include a lower region which is inside an 'a' region and an upper region which is outside the 'a' region.

Therefore, a virtual line extending from the 'a' region to the 'b' region and a cross-sectional direction of the protector 200 may define an angle of inclination θ. The angle of inclination θ may also be defined in the 'b' region and the 'c' region. The angle of inclination θ may be an angle at which the ribs 310 are placed with respect to the plane of the protector 200.

Curved substrates CS may be placed on the ribs 310 sloping at the angle of inclination θ. Since the curved substrates CS having various radii of curvature are placed on the ribs 310 sloping at the angle of inclination θ, the interference with adjacent curved substrates CS may be reduced.

Each of the rib members 300-1 includes a rib 310 and second and third protrusions 320 and 330 protruding from the rib 310. In an exemplary embodiment, each of the rib members 300-1 may include a paper material, for example. The rib 310 including paper may be divided into two regions and may be folded to provide each of the rib members 300-1.

Here, the rib 310 may include a first rib 310a and a second rib 310b. In addition, each of the rib members 300-1 may include (3-1)$^{th}$ protrusions 330a protruding from a body of the first rib 310a and (3-2)$^{th}$ protrusions 330b protruding from a body of the second rib 310b.

A folding region F1 may be disposed between the first rib 310a and the second rib 310b. The folding region F1 may be disposed on a side opposite each region in which the second protrusion 320 is disposed. Therefore, the rib 310 including the first rib 310a and the second rib 310b may be folded along the folding region F in a direction perpendicular to a lengthwise direction.

The body of the first rib 310a and the body of the second rib 310b may have different shapes. Specifically, the body of the second rib 310b may include an extension portion E in addition to the body of the first rib 310a.

The extension portion E may extend further than the body of the first rib 310a. Therefore, when the first rib 310a and the second rib 310b are placed on top of each other, the extension portion E of the second rib 310b may first contact the plane of the protector 200. Since the extension E first contacts the plane of the protector 200, the angle of inclination θ may naturally be defined with respect to the cross-sectional direction of the protector 200.

The extension portion E may cause the (3-1)$^{th}$ protrusions 330a and the (3-2)$^{th}$ protrusions 330b to have different lengths. When the (3-1)$^{th}$ protrusions 330a and the (3-2)$^{th}$ protrusions 330b have equal lengths, the (3-2)$^{th}$ protrusions 330b may be inserted deeper into the third holes 230 than the (3-1)$^{th}$ protrusions 330a due to the extension portion E. When the (3-1)$^{th}$ protrusions 330a and the (3-2)$^{th}$ protrusions 330b have different lengths, they may be inserted into the third holes 230 to similar depths despite the extension portion E as illustrated in the drawings.

When the rib members 300-1, each having the first rib 310a and the second rib 310b of different sizes, are coupled to the protector 200, specifically, when the third protrusions 330 are coupled to the third holes 230, the angle of inclination θ may naturally be defined with respect to the plane of the protector 200.

Therefore, the ribs 310 corresponding to the shape of the curved substrates CS with concave and convex surfaces, that is, the ribs 310 sloping at a predetermined angle to the plane of the protector 200 may prevent the contact between the curved substrates CS and make it easy to insert or remove the curved substrates CS. In addition, the cassette including paper may reduce manufacturing costs and improve loading capacity.

Referring to FIGS. 6 and 7, to define the angle of inclination θ of each rib 310 to the plane of the protector 200, a thickness of the extension portion E or a thickness of a T region in which holes are misaligned with each other are summarized in Table 1.

First, each of A, B and D indicates a paper thickness of the protector 200 or each rib 310. Specifically, A indicates a thickness of about 5 millimeters (mm), B indicates a thickness of about 3 mm, and D indicates a thickness of about 1.8 mm to about 2 mm. In addition, AB indicates a thickness of a structure obtained by stacking paper having a thickness of A and paper having a thickness of B.

TABLE 1

| | | Value: E, T | | | | | | | |
|---|---|---|---|---|---|---|---|---|---|
| | Angle (θ) | D (1.8~2) | B (3) | A (5) | BB (6) | AB (8) | AA (10) | AAA (15) | 2AAA (30) |
| | 1° | 0.1 | 0.1 | 0.1 | 0.2 | 0.2 | 0.3 | 0.4 | 0.8 |
| R3000 | 3° | 0.1 | 0.2 | 0.3 | 0.3 | 0.4 | 0.5 | 0.8 | 1.6 |
| | 6° | 0.2 | 0.3 | 0.5 | 0.8 | 0.8 | 1.1 | 1.6 | 3.2 |
| R1800 | 7° | 0.2 | 0.4 | 0.6 | 0.7 | 1 | 1.2 | 1.8 | 3.7 |
| | 9° | 0.3 | 0.5 | 0.8 | 1 | 1.3 | 1.6 | 2.4 | 4.8 |
| | 20° | 0.7 | 1.1 | 1.8 | 2.2 | 2.9 | 3.6 | 5.5 | 10.9 |
| | 30° | 1.2 | 1.7 | 2.9 | 3.5 | 4.6 | 5.8 | 8.7 | 17.3 |
| | 45° | 2 | 3 | 5 | 6 | 8 | 10 | 15 | 30 |

The angle of inclination θ may be defined as "tan θ=T/protector thickness" or "tan θ=rib thickness." Here, tan 1 may be defined as approximately 0.0175.

Tan θ=1(extension portion thickness)/8(rib thickness) may be calculated to be 0.1225, for example. Thus, θ may have a value of about 7 degrees. Accordingly, the angle of inclination θ that may accommodate a curved structure having a radius of curvature of about 1800 mm may be defined. In this way, the angle of inclination θ of the ribs 300 to the plane of the protector 200 may be defined by adjusting the thickness of the extension portion E.

In another example, tan θ=1.2(T region thickness)/10 (protector thickness) may be calculated to be 0.12. Thus, θ may have an approximate value of 7 degrees. In this way, the formation of a plurality of holes 230a, 230b and 230c misaligned with each other in a plurality of laminate layers 200a, 200b and 200c of the protector 200 may define the angle of inclination θ of the ribs 310.

Referring to FIGS. 9 and 10, a body of a third rib 310c and a body of a fourth rib 310d may have different shapes. Specifically, the fourth rib 310d may include an extension portion E in addition to the body of the third rib 310c.

The extension portion E may extend relatively further toward third protrusions than the body of the third rib 310c. Therefore, when the third rib 310c and the fourth rib 310d are placed on top of each other, the extension portion E of the fourth rib 310d may first contact a plane of a protector 200. Since the extension portion of the fourth rib 310d first contacts the plane of the protector 200, an angle of inclination θ may naturally be defined with respect to a cross-sectional direction of the protector 200.

Similarly to the case of FIG. 7, the rib member 300-2 may include (3-3)$^{th}$ protrusions 330c protruding from the body of the third rib 310c and (3-4)$^{th}$ protrusions 330d protruding from the body of the fourth rib 310d. To avoid a redundant description, FIG. 7 is cited for the (3-3)$^{th}$ protrusions 330c and the (3-4)$^{th}$ protrusions 330d.

Referring to FIG. 9, a folding region F2 may be provided along a lengthwise direction of the third rib 310c and the fourth rib 310d. Therefore, the rib member 300-2 including the third rib 310c and the fourth rib 310d may be folded along the folding region F2 in the lengthwise direction.

In addition, the third rib 310c and the fourth rib 310d may include a (2-3)$^{th}$ protrusion 320c and a (2-4)$^{th}$ protrusion 320d, respectively. The (2-3)$^{th}$ protrusion 320c and the (2-4)$^{th}$ protrusion 320d may have different shapes. In an exemplary embodiment, when the (2-4)$^{th}$ protrusion 320d is larger than the (2-3)$^{th}$ protrusion 320c, the (2-3)$^{th}$ protrusion 320c and the (2-4)$^{th}$ protrusion 320d may be forcibly fitted into second holes 120. Therefore, the angle of inclination θ of each rib 310 may naturally be defined with respect to the plane of the protector 200 by the second holes 120, the (2-3)$^{th}$ protrusion 320c and the (2-4)$^{th}$ protrusion 320d.

Therefore, the ribs 310 corresponding to the shape of curved substrates CS with concave and convex surfaces, that is, the ribs 310 sloping at a predetermined angle to the plane of the protector 200 may prevent the contact between the curved substrates CS and make it easy to insert or remove the curved substrates CS. In addition, the cassette including paper may reduce manufacturing costs and improve loading capacity.

Referring to FIG. 10, the (3-3)$^{th}$ protrusions 330c may be partially misaligned with the (3-4)$^{th}$ protrusions 330d. Here, FIG. 10 will be described by citing FIG. 9. A folding region F3 is disposed along the lengthwise direction of the third rib 310c and the fourth rib 310d. However, unlike the folding region F2, the folding region F3 may be disposed only in a specific region.

A region in which each of the (3-3)$^{th}$ protrusions 330c is misaligned with and asymmetrical to a corresponding one of the (3-4)$^{th}$ protrusions 330d is defined as a G region. The G region may make it easy for the (3-3)$^{th}$ protrusions 330c and the (3-4)$^{th}$ protrusions 330d to be coupled to third holes 230. Specifically, each of the third holes 230 may be defined in a staircase shape having steps. Accordingly, protrusions are forcibly fitted into the third holes 230. In the current embodiment, however, due to the region G in which each of the (3-3)$^{th}$ protrusions 330c is misaligned with the corresponding one of the (3-4)$^{th}$ protrusions 330d, the (3-3)$^{th}$ protrusions 330c and the (3-4)$^{th}$ protrusions 330d may be easily coupled to the third holes 230.

Therefore, ribs 310 corresponding to the shape of curved substrates CS with concave and convex surfaces, that is, the ribs 310 sloping at a predetermined angle to the plane of the protector 200 may prevent the contact between the curved substrates CS and make it easy to insert or remove the curved substrates CS. In addition, the cassette including paper may reduce manufacturing costs and improve loading capacity.

Figure 11:
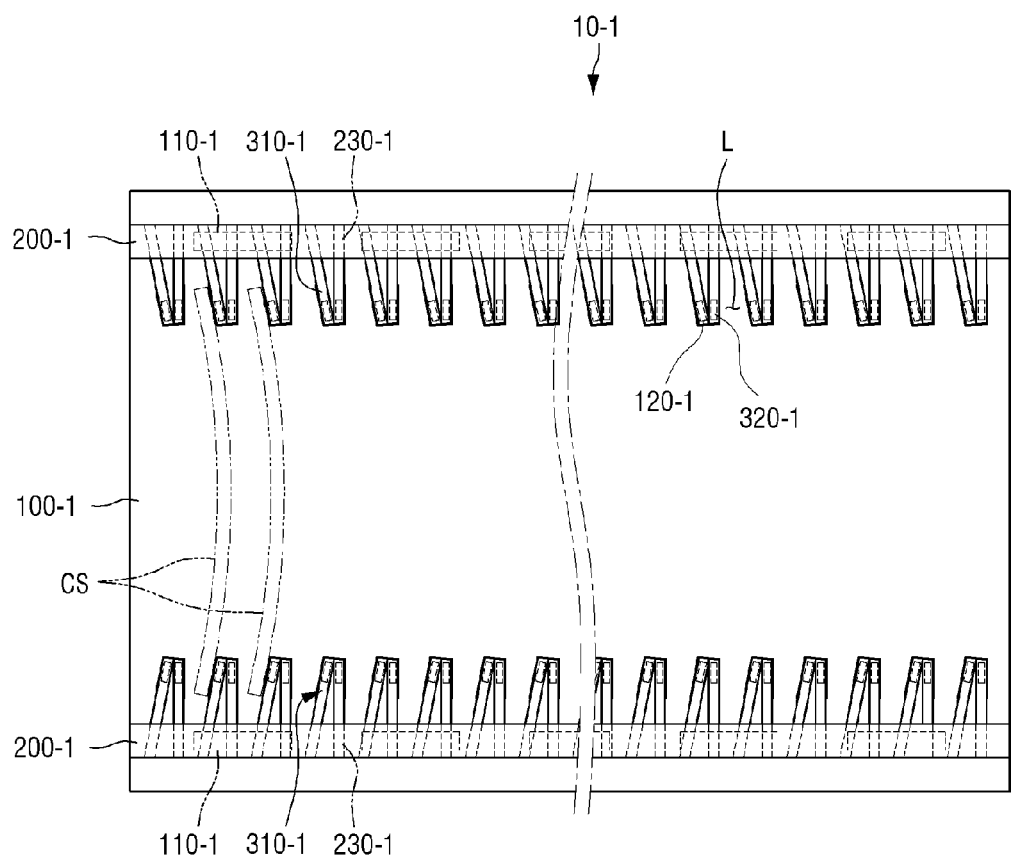
FIG. 11 is a plan view of another exemplary embodiment of a cassette for curved substrates according to the invention.
Figure 12:
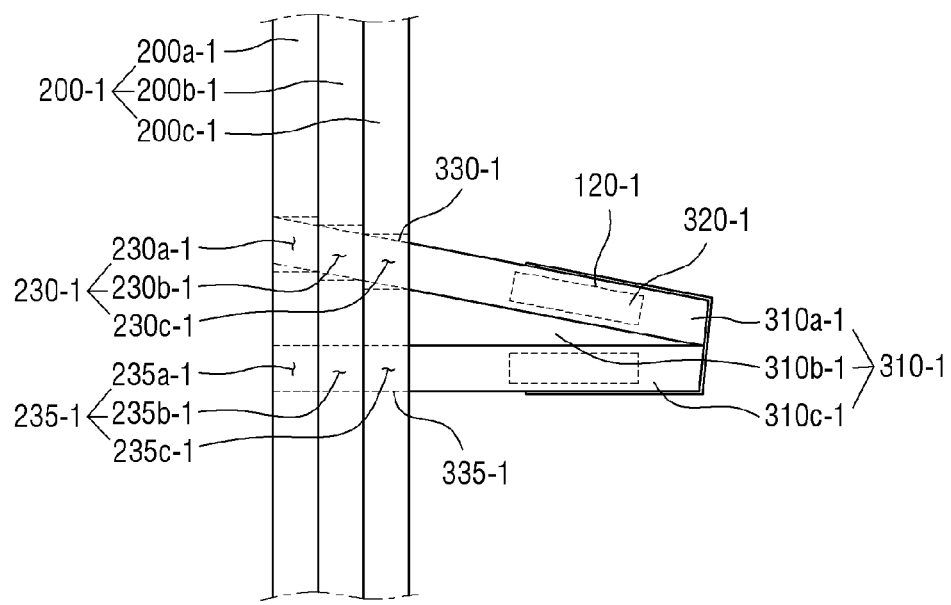
FIGS. 12 and 13 are cross-sectional views illustrating the coupling of a protector to a rib member in the cassette of FIG. 11.
Figure 13:
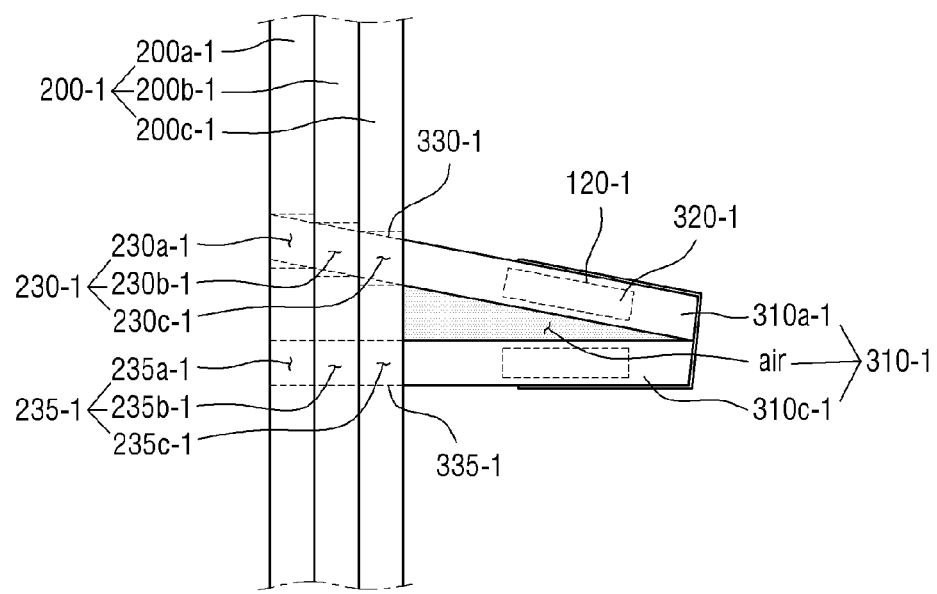

FIG. 11 is a plan view of a cassette 10-1 for curved substrates according to another exemplary embodiment of the invention. FIGS. 12 and 13 are cross-sectional views illustrating the coupling of a protector 200-1 to a rib member 300-1 in the cassette 10-1 of FIG. 11.

The cassette 10-1 may include the protector 200-1. The protector 200-1 includes a body and a plurality of first protrusions protruding from the body. FIGS. 1 through 4 will be cited here. The first protrusions may protrude from any one thickness surface of the body such that a plane of the body is perpendicular to a plane of a base plate 100-1.

The first protrusions may be coupled to first holes 110-1. The protector 200-1 may extend from both edges of the base plate 100-1 in a direction perpendicular to the plane of the base plate 100-1, thereby forming a housing space with the base plate 100-1.

Curved substrates CS may be loaded or carried in the housing space. The protector 200-1 may make it easy to transport the curved substrates CS loaded into the housing space and protect the curved substrates CS from external impact.

The protector 200-1 may include a paper material having a predetermined thickness. In addition, a plurality of layers of paper, each layer having a predetermined thickness, may be stacked to provide certain strength. Here, the protector 200-1 includes a plurality of laminate layers 200a, 200b and 200c as described above with reference to FIGS. 1 through 4.

Third holes 230-1, each defined by connecting a plurality of holes that partially overlap the laminate layers, may be defined in the protector 200-1. Accordingly, the third holes 230-1 may slope at a predetermined angle to a cross-sectional direction of the protector 200-1. The third holes 230-1 sloping at the predetermined angle to the cross-sectional direction of the protector 200 will be described in detail below.

The cassette 10-1 may include rib members. The rib members include ribs 310-1 which support the curved substrates CS, second protrusions (similar to the second protrusion 320 of FIG. 4) which protrude in a direction from the ribs 310-1, and third protrusions 330-1 and fourth protrusions 335-1 which protrude in another direction from the ribs 310-1.

Each of the rib members may be a stack of multiple layers of paper. Each of the rib members may be provided by stacking multiple layers of paper such that the ribs 310-1 may have enough strength to support the curved substrates CS. However, the invention is not limited thereto, and each of the rib members may also be provided by folding paper in half or connecting pieces of paper of various shapes.

A part of each of the rib members may be coupled to the protector 200-1, and another part of each of the rib members may be coupled to the base plate 100-1.

The second protrusions of the rib members may be coupled to the base plate 100-1 and protrude from the ribs 310-1 toward the base plate 100-1. In addition, the third protrusions 330-1 and the fourth protrusions 335-1 of the rib members may be coupled to the protector 200-1 and protrude from the ribs 310-1 toward the protector 200-1. Therefore, since the plane of the base plate 100-1 and the body of the protector 200-1 are placed perpendicular to each other, the second protrusions may be perpendicular to the third protrusions 330-1 and the fourth protrusions 335-1 with respect to the ribs 310-1.

The third protrusions 330-1 and the fourth protrusions 335-1 of the rib members may be respectively coupled to the third holes 230-1 and the fourth holes 235-1 of the protector 200-1. In addition, the second protrusions of the rib members may be coupled to second holes 120-1 of the base plate 100-1.

The rib members may be disposed at both edges of the base plate 100-1 and protrude from the body of the protector 200-1 at equal intervals. The rib members disposed at an edge of the base plate 100-1 may correspond to those disposed at the other edge of the base plate 100-1.

The rib members may be coupled to the second holes 120-1, respectively. Here, the second holes 120-1 may be separated from each other by a predetermined gap. Accordingly, the ribs 310-1 may be separated from each other by the predetermined gap, and each of the curved substrates CS may be loaded and carried on the predetermined gap. That is, the gap which is a space for loading and carrying a curved substrate CS is defined as a loading region L. The loading region L will be described by citing FIGS. 1 through 4.

Therefore, since the ribs 310-1 support the curved substrates CS by substantially contacting the curved substrates CS, the loading region L between adjacent ribs 310-1 and a protruding length of the ribs 310-1 may vary according to the type of the curved substrates CS. Here, the ribs 310-1 may support the curved substrates CS by contacting edges of convex surfaces of the curved substrates CS. In addition, the gap between the second holes 120-1 coupled to the rib members may vary according to the loading region L.

Loading defects may occur when the curved substrates CS are loaded on the loading regions L. To prevent the loading defects, the curved substrates CS may be placed at predetermined intervals, and the ribs 310-1 may be placed to slope to correspond to the shape of the curved substrates CS having concave and convex surfaces. In other words, the ribs 310-1 may be placed at an angle to the plane of the protector 200-1 by the third protrusions 330-1 and the fourth protrusions 335-1 and the third holes 230-1 and fourth holes 235-1.

Specifically, the third holes 230-1 may be defined in the body of the protector 200-1 to slope at a predetermined angle to a cross-section of the protector 200-1, and the fourth holes 235-1 may be defined in the body of the protector 200-1 to be perpendicular to the cross-section of the protector 200-1.

The third protrusions 330-1 and the fourth protrusions 335-1 may respectively be coupled to the sloping third holes 230-1 and the fourth holes 235-1 perpendicular to the cross-section of the protector 200-1. Therefore, the ribs 310-1 unitary with the third protrusions 330-1 and the fourth protrusions 335-1 may be placed to slope at a predetermined angle to the plane of the protector 200-1 by the third protrusions 330-1 and the third holes 230-1. In addition, the ribs 310-1 may be placed perpendicular to the plane of the protector 200-1 by the fourth protrusions 335-1 and the fourth holes 235-1. Accordingly, the capability of the ribs 310-1 to support the curved substrates CS may be improved.

As described above, the second protrusions, the third protrusions 330-1, and the fourth protrusions 335-1 and the ribs 310-1 may be unitary with each other, and the ribs 310-1 may be placed to slope at a predetermined angle to the plane of the protector 200-1 by coupling directions of the second protrusion and the third and fourth protrusions 330-1 and 335-1. In addition, the capability of the ribs 310-1 to support the curved substrates CS may be improved by the fourth protrusions 335-1.

Therefore, the ribs 310-1 corresponding to the shape of the curved substrates CS with the concave and convex surfaces, that is, the ribs 310-1 sloping at a predetermined angle to the plane of the protector 200-1 may prevent the contact between the curved substrates CS and make it easy to insert or remove the curved substrates CS. In addition, the cassette 10-1 including paper may reduce manufacturing costs, improve loading capacity, and easily accommodate the large-sized curved substrates CS.

Referring to FIG. 12, the protector 200-1 may include a plurality of laminated layers of paper. The protector 200-1 may include the third holes 230-1 and the fourth holes 235-1, and each of the third and fourth holes 230-1 and 235-1 may include holes respectively defined in the laminated layers of paper. The protector 200-1 may include a stack of a first laminate layer 200a, a second laminate layer 200b, and a third laminate layer 200c.

In a specific example, the first laminate layer 200a may include $(3\text{-}a)^{th}$ holes 230a-1 and $(4\text{-}a)^{th}$ holes 235a-1, the second laminate layer 200b-1 may include $(3\text{-}b)^{th}$ holes 230b-1 and $(4\text{-}b)^{th}$ holes 235b-1, and the third laminate layer 200c-1 may include $(3\text{-}c)^{th}$ holes 230c-1 and $(4\text{-}c)^{th}$ holes 235c-1. Here, a case where the protector 200-1 includes three laminate layers is described as an example. However, the invention is not limited to this case, and the protector 200-1 may also include four or five laminate layers.

The $(3\text{-}a)^{th}$ holes 230a, the $(3\text{-}b)^{th}$ holes 230b, and the $(3\text{-}c)^{th}$ holes 230c may be defined parallel to the base plate 100-1 or parallel to the direction normal to a lengthwise direction of the protector 200-1 and may be partially misaligned with each other. Due to such disposition of the $(3\text{-}a)^{th}$ holes 230a, the $(3\text{-}b)^{th}$ holes 230b and the $(3\text{-}c)^{th}$ holes 230c, each of the third holes 230-1 may be defined in a staircase shape.

The third protrusions 330-1 may be coupled to the third holes 230-1 defined in a staircase shape by the disposition of the $(3\text{-}a)^{th}$ holes 230a, the $(3\text{-}b)^{th}$ holes 230b and the $(3\text{-}c)^{th}$ holes 230c. Accordingly, the third protrusions 330-1 may be forcibly fitted into the third holes 230-1. The third holes 230-1 having the staircase shape may improve the capability of the third protrusions 330-1 to maintain a slope. Thus, the ribs 310-1 may maintain a predetermined angle to the plane of the protector 200-1. Further, since the second protrusions (similar to the second protrusion 320 of FIG. 4) of the rib members are coupled to the sloping second holes 120-1, the slope-maintaining capability may be further improved.

The $(4\text{-}a)^{th}$ holes 235a-1, the $(4\text{-}b)^{th}$ holes 235b-1, and the $(4\text{-}c)^{th}$ holes 235c-1 may be defined parallel to the base plate 100-1 or parallel to the direction normal to the lengthwise direction of the protector 200-1. Unlike the $(3\text{-}a)^{th}$ holes 230a, the $(3\text{-}b)^{th}$ holes 230b and the $(3\text{-}c)^{th}$ holes 230c of the third holes 230-1, the $(4\text{-}a)^{th}$ holes 235a-1, the $(4\text{-}b)^{th}$ holes 235b-1 and the $(4\text{-}c)^{th}$ holes 235c-1 of the fourth holes 235-1 may completely overlap each other without being partially misaligned with each other. Accordingly, the fourth protrusions 335-1 may be coupled to the fourth holes 235-1 to perfectly fit the fourth holes 235-1. In addition, the capability of the ribs 310-1 to support the curved substrates CS may be improved by the fourth holes 235-1 horizontally coupled to the fourth protrusions 335-1.

Each of the ribs 310-1 may include a $(1\text{-}1)^{th}$ rib 310a-1, a $(1\text{-}2)^{th}$ rib 310b-1, and a $(1\text{-}3)^{th}$ rib 310c-1. Here, the $(1\text{-}1)^{th}$ rib 310a-1, the $(1\text{-}2)^{th}$ rib 310b-1, and the $(1\text{-}3)^{th}$ rib 310c-1 may be unitary with each other using a paper material.

The $(1\text{-}1)^{th}$ rib 310a-1 may extend toward a third protrusion 330-1 to be coupled to a third hole 230-1. The $(1\text{-}3)^{th}$ rib 310c-1 may extend toward a fourth protrusion 335-1 to be coupled to a fourth hole 250-1.

In addition, the $(1\text{-}2)^{th}$ rib 310b-1 may be disposed between the $(1\text{-}1)^{th}$ rib 310a-1 and the $(1\text{-}3)^{th}$ rib 310c-1.

Referring to FIGS. 7 through 9 and 12, the $(1\text{-}2)^{th}$ rib 310b-1 may include an extension portion E such that the $(1\text{-}1)^{th}$ rib 310a-1 may naturally have an angle of inclination $\theta$ to the plane of the protector 200-1.

The convex surface of each of the curved substrates CS may be placed on the $(1\text{-}1)^{th}$ rib 310a-1 sloping at the angle of inclination $\theta$. Accordingly, since each of the curved substrates CS having various radii of curvature is placed on the $(1\text{-}1)^{th}$ rib 310a-1 sloping at the angle of inclination $\theta$, the interference between adjacent curved substrates CS may be reduced.

Unlike in FIG. 12, in FIG. 13, the $(1\text{-}2)^{th}$ rib 310b-1 may be provided as an air region.

As described above, the second protrusions, the third protrusions 330-1, the fourth protrusions 335-1 and the ribs 310-1 may be unitary with each other, and the ribs 310-1 may be placed to slope at a predetermined angle to the plane of the protector 200-1 by the coupling directions of the second protrusion and the third and fourth protrusions 330-1 and 335-1. In addition, the capability of the ribs 310-1 to support the curved substrates CS may be improved by the fourth protrusions 335-1.

Therefore, the ribs 310-1 corresponding to the shape of the curved substrates CS with the concave and convex surfaces, that is, the ribs 310-1 sloping at a predetermined angle to the plane of the protector 200-1 may prevent the contact between the curved substrates CS and make it easy to insert or remove the curved substrates CS. In addition, the cassette 10-1 including paper may reduce manufacturing costs, improve loading capacity, and easily accommodate the large-sized curved substrates CS.

Embodiments of the invention provide a cassette for curved substrates, in which the contact between curved substrates having concave and convex surfaces may be prevented and into or from which the curved substrates may be easily inserted or removed.

In addition, the cassette includes paper, thereby reducing manufacturing costs and improving loading capacity.

However, the effects of the invention are not restricted to the one set forth herein. The above and other effects of the invention will become more apparent to one of daily skill in the art to which the invention pertains by referencing the claims.

The foregoing is illustrative of the invention and is not to be construed as limiting thereof. Although a few embodiments of the invention have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific embodiments disclosed, and that modifications to the disclosed embodiments, as well as other exemplary embodiments, are intended to be included within the scope of the appended claims. The invention is defined by the following claims, with equivalents of the claims to be included therein.

What is claimed is:

1. A cassette for curved substrates, the cassette comprising:
   a base plate in which first and second holes are defined at both opposite edges thereof;
   a protector which is coupled to the first hole disposed at the both opposite edges of the base plate, is placed in a direction perpendicular to a plane of the base plate, and in which a plurality of third holes is defined; and a rib member which comprises a rib protruding from the protector to support a curved substrate, a second protrusion protruding in a direction from the rib to be coupled to the second hole, and a plurality of third protrusions protruding in another direction from the rib to be coupled to the plurality of third holes, wherein the plurality of third holes of the rib member are defined to slope at a predetermined angle to a thickness surface of the protector such that the rib is at a predetermined angle with reference to a plane of the protector, and the plurality of third protrusions are coupled to the plurality of third holes.

2. The cassette of claim 1, wherein the base plate, the protector, and the rib member include a paper material.

3. The cassette of claim 1, wherein the protector comprises a plurality of laminate layers.

4. The cassette of claim 1, wherein the protector comprises a first protrusion protruding from a body thereof, wherein the first protrusion is coupled to the first hole.

5. The cassette of claim 1, wherein the second protrusion and the plurality of third protrusions are perpendicular to each other with respect to the rib.

6. The cassette of claim 1, wherein the second protrusion, the plurality of third protrusions, and the rib are unitary with each other, and the rib is placed to slope at a predetermined angle with reference to a coupling direction of the second protrusion and the plurality of third protrusions.

7. The cassette of claim 4, wherein the rib member is disposed at the both opposite edges of the base plate and protrudes from the body of the protector to be separated from each adjacent rib member by an equal distance, wherein the rib member disposed at the edge of the base plate corresponds to the rib member disposed at the other edge of the base plate.

8. The cassette of claim 1, wherein the second protrusion is coupled to the second hole defined in the same direction as a direction in which the rib slopes.

9. The cassette of claim 1, wherein a (3-a)-th hole defined in a first laminate layer, a (3-b)-th hole defined in a second laminate layer, and a (3-c)-th hole defined in a third laminate layer are defined in the protector.

10. The cassette of claim 9, wherein the (3-a)-th hole, the (3-b)-th hole, and the (3-c)-th hole are defined parallel to the base plate or parallel to a direction normal to a lengthwise direction of the protector and are partially misaligned with each other to define each of the plurality of third holes in a staircase shape.

11. The cassette of claim 10, wherein each of the plurality of third holes defined in a staircase shape by the partial misalignment of the (3-a)-th hole, the (3-b)-th hole and the (3-c)-th hole has a predetermined angle of inclination to the plane of the protector.

12. The cassette of claim 1, wherein the rib member comprises a first rib and a second rib having different shapes, wherein the second rib further comprises an extension portion which extends relatively further toward the plurality of third protrusions than toward the first rib.

13. The cassette of claim 12, wherein the extension portion and the first rib contact the plane of the protector.

14. The cassette of claim 12, wherein the plurality of third protrusions of the first rib are different in size from those of the second rib.

15. The cassette of claim 12, wherein the plurality of third protrusions of the first rib are asymmetrical to those of the second rib.

16. The cassette of claim 12, wherein the second protrusion of the first rib is different in size from that of the second rib.

17. The cassette of claim 12, wherein a folding region is disposed between the first rib and the second rib.

18. The cassette of claim 12, wherein the rib member comprises the plurality of third protrusions on the first rib and further comprises fourth protrusions on the second rib, and the protector further comprises fourth holes coupled to the fourth protrusions.

19. The cassette of claim 18, wherein a third rib is further disposed between the first rib and the second rib.

20. The cassette of claim 19, wherein the third rib is filled with air.

* * * * *